United States Patent [19]

Ahn

[11] Patent Number: 5,593,815
[45] Date of Patent: Jan. 14, 1997

[54] CLEAVING PROCESS IN MANUFACTURING A SEMICONDUCTOR LASER

[75] Inventor: Hyung S. Ahn, Kyonggy-do, Rep. of Korea

[73] Assignee: Goldstar Co., Ltd., Seoul, Rep. of Korea

[21] Appl. No.: 390,379

[22] Filed: Feb. 17, 1995

Related U.S. Application Data

[63] Continuation-in-part of Ser. No. 208,033, Mar. 9, 1994, abandoned, which is a continuation of Ser. No. 948,307, Sep. 22, 1992, abandoned, which is a continuation-in-part of Ser. No. 556,421, Jul. 24, 1990, abandoned.

[30] Foreign Application Priority Data

Jul. 31, 1989 [KR] Rep. of Korea ............... 10858/1989

[51] Int. Cl.$^6$ ..................... H01L 21/302; G03F 7/40
[52] U.S. Cl. ............... 430/321; 430/320; 430/313; 430/314; 430/319; 430/297; 437/226; 437/227; 437/228; 437/905; 437/924
[58] Field of Search ............... 430/297, 321, 430/22, 320, 313, 314, 319; 437/129, 226, 227, 228, 229, 905, 924; 372/44, 50

[56] References Cited

U.S. PATENT DOCUMENTS

| | | | |
|---|---|---|---|
| 4,236,296 | 12/1980 | Woolhouse et al. | 437/226 |
| 4,306,351 | 12/1981 | Ohsaka et al. | 437/227 |
| 4,632,884 | 12/1986 | Shikatani et al. | 437/249 |
| 4,670,966 | 6/1989 | De Poorter et al. | 437/129 |
| 4,883,771 | 11/1989 | Kumabe et al. | 437/129 |
| 4,915,774 | 4/1990 | Schiller et al. | 437/249 |
| 5,206,181 | 4/1993 | Gross | 437/226 |

FOREIGN PATENT DOCUMENTS

| | | | |
|---|---|---|---|
| 54-136173 | 10/1979 | Japan | 437/226 |
| 58-166741 | 10/1983 | Japan | 437/227 |
| 59-200437 | 11/1984 | Japan | 437/226 |
| 60-123086 | 7/1985 | Japan | 437/129 |
| 58-123086 | 7/1985 | Japan | 437/129 |
| 62-35642 | 2/1987 | Japan | 437/226 |
| 62-249418 | 10/1987 | Japan | 437/226 |
| 63-215089 | 9/1988 | Japan | . |
| 1-183133 | 7/1989 | Japan | 437/227 |
| 1270308 | 10/1989 | Japan | 437/227 |
| 1-304721 | 12/1989 | Japan | 437/226 |
| 233948 | 2/1990 | Japan | 437/226 |
| 2-192143 | 7/1990 | Japan | 437/226 |

Primary Examiner—Martin J. Angebranndt

[57] ABSTRACT

A method of cleaving a semiconductor wafer is disclosed which includes coating a first photoresist on a front surface of a semiconductor wafer having a plurality of semiconductor laser elements formed on the semiconductor wafer, patterning the first photoresist so as to form guide mark patterns for cleaving, coating a second photoresist on a rear surface of the semiconductor wafer, removing an edge part located at the guide mark patterns for cleaving of the second photoresist, etching through the semiconductor wafer to form guide marks using the patterned first and second photoresists as masks, patterning the second photoresist to form stripe patterns in the rear surface, etching the rear surface of the semiconductor wafer so as to form V-shaped or dovetail shaped grooves, removing the first photoresist and the second photoresist, and cleaving the semiconductor wafer along the V-shaped or dovetail shaped grooves into bars, each bar being a semiconductor laser.

3 Claims, 6 Drawing Sheets

25°C

CLEAVING PROCESS IN MANUFACTURING A SEMICONDUCTOR LASER

This application is a continuation-in-part, of application Ser. No. 08/208,033 filed on Mar. 9, 1994, now abandoned; which was a continuation of application Ser. No. 07/948,307 filed on Sep. 22, 1992, now abandoned; which was a continuation-in-part of of application Ser. No. 07/556,421 filed on Jul. 24, 1990, now abandoned.

BACKGROUND OF THE INVENTION

1. Field of the Invention

The present invention relates to a photolithography process for carrying out a cleaving in manufacturing a semiconductor laser and more particularly, to a photolithography process for carrying out a cleaving in order to form a reflecting face of a mirror of a laser.

2. Description of the Related Art

Several types of photolithography processes are well known in the art. One of such processes discloses a substrate as shown in FIGS. 1(a) and 1(b).

That is, as shown in FIGS. 1(a) and 1(b), a line 1 is formed on a growth layer 2 disposed on the front face of the substrate by the use of a scribing machine after the substrate has undergone a step of forming a metal electrode and then, it is formed into the shape of a bar as shown in FIG. 1(b). The bar formed in such a way is used in protecting a mirror face 3 of a laser diode by carrying out a coating on the mirror in order to prevent the oxidation of the mirror face.

The cleaving is carried out in such a manner that the diode is cleaved by means of a diamond blade in a state with the growth layer 2 laid upwardly and the cleavings are made at the intervals of 350–300 μm for thereby forming cleaved bars. However, in such a cleaving method, the surface of the growth layer 2 and the edges thereof are damaged to a severe degree so that the mirror face 3 which is closely related with the life expectancy of the laser diode is rendered to be difficult from being protected, which thereby lowers the yield of the chips.

SUMMARY OF THE PRESENT INVENTION

Accordingly, it is one object of the present invention to provide an improved photolithography process for manufacturing a semiconductor laser.

Another object of the present invention is to provide a photolithography process for carrying out a cleaving in manufacturing the semiconductor laser in which the reflecting face of a mirror of the semiconductor laser can be protected from damage during the cleaving step for extending the life expectancy thereof.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

Briefly described, the present invention relates to a process for manufacturing a semiconductor laser which comprises the steps of coating a first photoresist on a front surface of a semiconductor wafer having a plurality of semiconductor laser elements formed on said semiconductor wafer, patterning the first photoresist so as to form guide mark patterns for cleaving, coating a second photo resist on a rear surface of said semiconductor wafer, removing an edge part of the second photoresist, wherein said edge part is located at the guide mark patterns for cleaving, etching the semiconductor wafer to form guide marks using the patterned first photoresist and the second photoresist as masks, the guide marks being formed through said semiconductor wafer, patterning the second photoresist to form stripe patterns for cleaving using said guide marks, etching the rear surface of said semiconductor wafer so as to form V-grooves, removing said first photoresist and said second photoresist, and cleaving said semiconductor wafer along said V-groove into bars, each bar being a semiconductor laser.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DESCRIPTION OF PREFERRED EMBODIMENTS

Figure 1A:
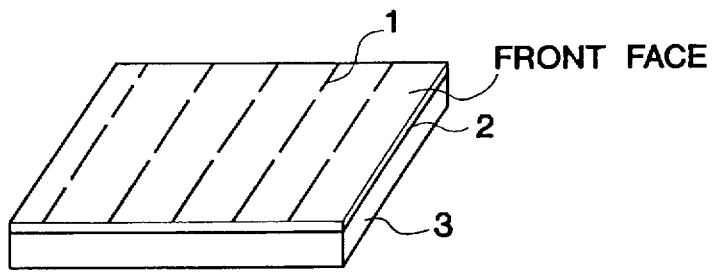
FIG. 1(a) is a perspective view of a scribed wafer of a conventional semiconductor laser.
Figure 1B:
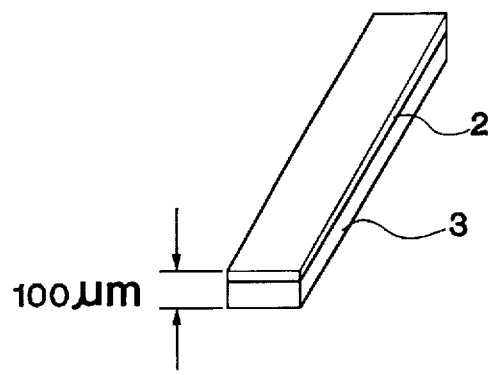
FIG. 1(b) is a perspective view of a scribed bar of a conventional semiconductor laser.
Figure 3:
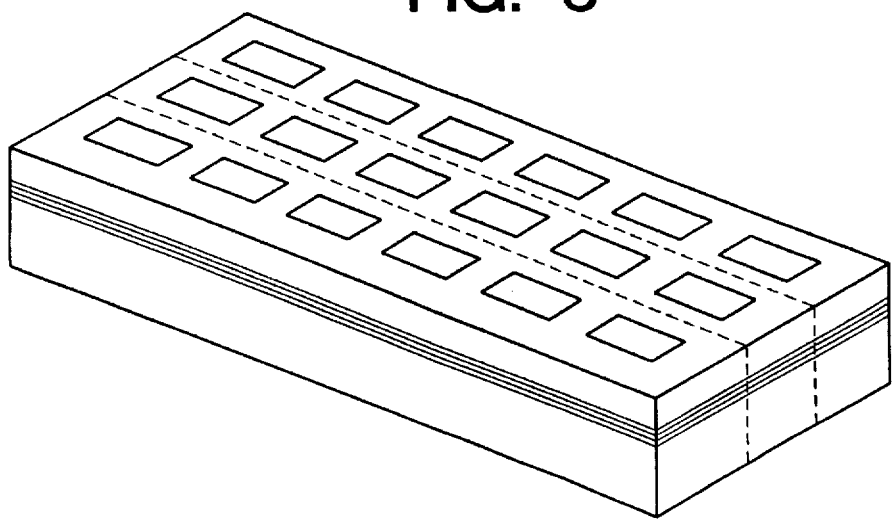
FIG. 3 is a view of the rear face of the substrate.
Figure 2A:
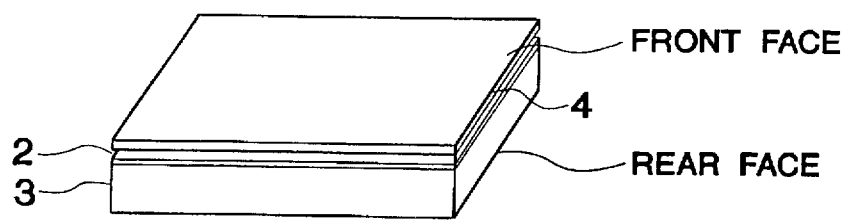
FIG. 2(a) is a perspective view of a wafer on which photoresist is coated on the front face of the semiconductor laser according to an embodiment of the present invention.
Figure 2B:
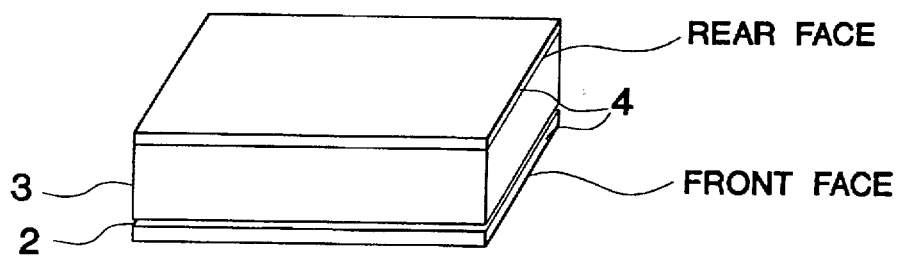
FIG. 2(b) is a perspective view of the wafer on which photoresist is coated on the rear face thereof.
Figure 2C:
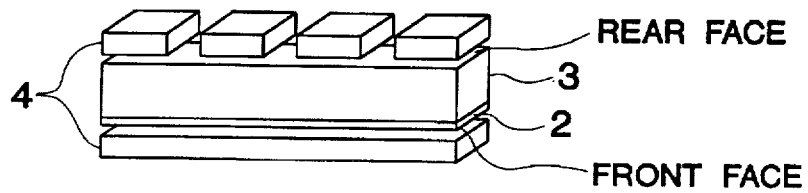
FIG. 2(c) is a perspective view of the wafer on which cleaving lines are formed.
Figure 2D:
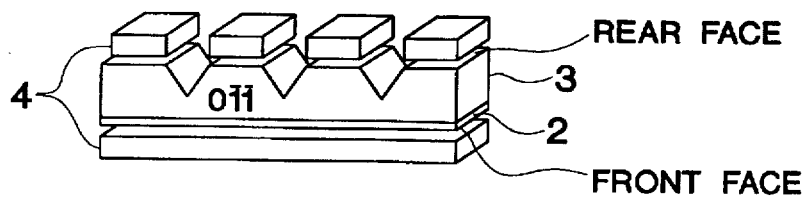
FIG. 2(d) is a perspective view of the wafer on which an etching is carried out along the cleaving lines.

Referring now in detail to the drawings for the purpose of illustrating preferred embodiments of the present invention, the photolithography process for carrying out a cleaving in manufacturing a semiconductor laser as shown in FIGS. 2(a), 2(b), 2(c), 2(d), and 2(e) includes the following steps:

First, a photoresist 4 is coated to form a protecting film so as to protect the front face of a GaAS wafer. Second, the photoresist 4 is coated on the rear face of the GaAs wafer as shown in FIG. 2(b). The rear face is indicated by the bottom part of the substrate as shown in FIG. 3. Third, cleaving lines are formed as shown (FIG. 2(c)). Fourth, cleaving grooves are formed by carrying out an etching along the cleaving lines (FIG. 2(d)).

Figure 2E:
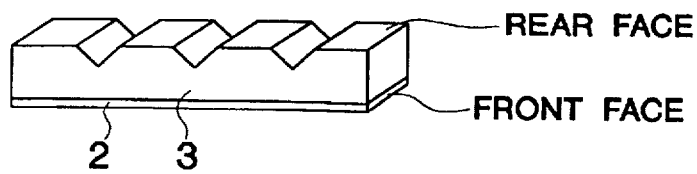
FIG. 2(e) is a perspective view of the wafer from which the photoresist is removed.

The etching time is adjusted in such a manner that wedge shaped grooves have to be formed along the cleaving lines if observed from the direction of Oii owing to the nature of the GaAs wafer. The photoresist 4 is removed so as to expose the cleaving lines on the rear face of the substrate and the cleaving can be conducted along the cleaving grooves as shown in FIG. 2(e).

The photolithography process (hereinafter, photo process) occupies most of the processes in the fabrication of the semiconductor device. The fabrication process of a laser diode also requires two or three steps of photo processing. The structure of the laser diode is determined by the photo processes.

For example, the fabrication process of VSIS (V-groove substrate inner stripe) laser diode will be explained hereinafter referring to FIG. 4(a) to FIG. 4(e).

Figure 4A:
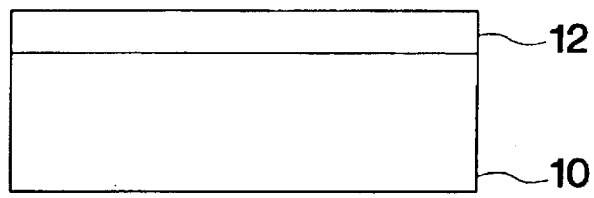
FIGS. 4(a)–4(f) are cross-sectional and perspective views of the laser diode formed by photolithography processes for an embodiment of the present invention.
Figure 4B:
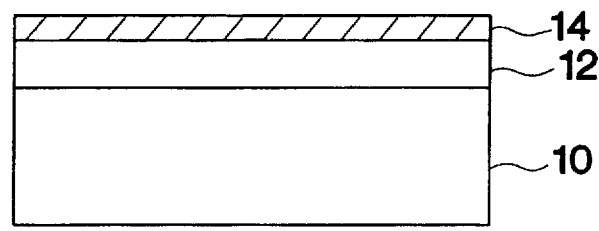
Figure 4C:
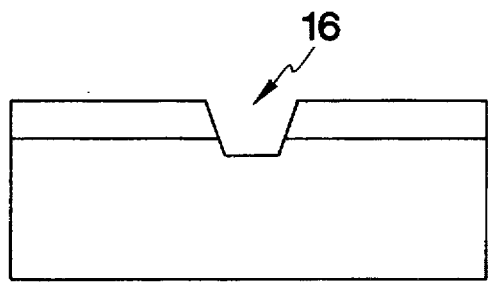

As shown in FIG. 4(a), a second conductive type of a GaAs layer 12 is grown on a first conductive type of substrate by Liquid Phase Epitaxy (LPE). Here, this GaAs layer 12 functions as a Current Blocking Layer (CBL). Subsequently, as shown in FIG. 4(b), a photo resist 14 is coated on the GaAs layer 12 and then a photo process is performed so that a V shape of a groove 16 is formed in the GaAs layer 12 as shown in FIG. 4(c).

Figure 4D:
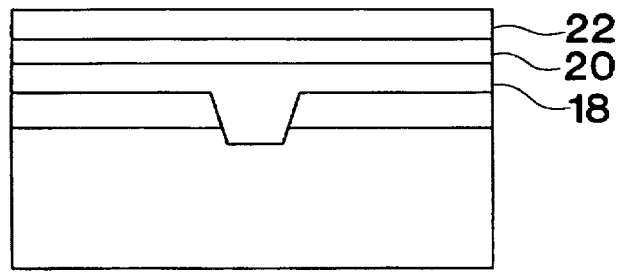
Figure 4E:
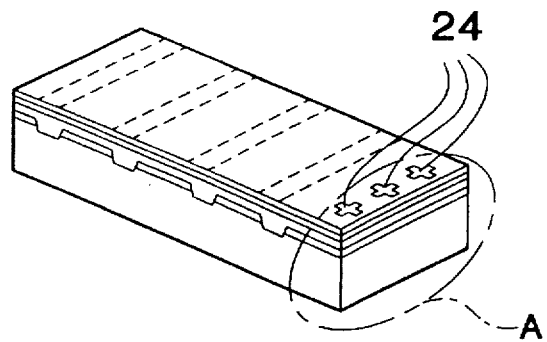

As shown in FIG. 4(d), several growth layers 18, 20 and 22 are formed by LPE in turn. Thereby, as shown in FIG. 4(e), one cannot see the position of the V-shaped groove when wafer's upper surface (the front face). Accordingly, a mark has to be made on the upper surface at a location above the V-shaped groove such that the V-shaped groove 16 is placed at a position corresponding to the central part of the laser diode on the wafer and after that laser diodes are exactly divided. As a result, as shown in an area (A) of FIG. 4(e) and FIG. 4(f), marks 24 for the shape of the electrode are required at the front face of the wafer and the marks 24 are formed on the upper side of the V-shaped groove 16. The marks 24 are formed by forming key patterns on the front surface using photoresist and the portions of the semiconductor wafer corresponding to the marks are then etched so that holes are formed through the semiconductor wafer so as to extend from the front surface to the back surface of the semiconductor wafer. The photolithographic process of this embodiment divides the wafer of FIG. 4(f) into each of the diodes.

Figure 4F:
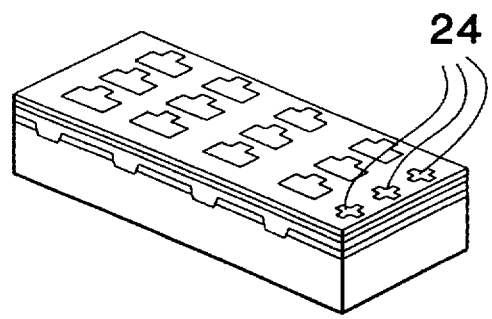

Namely, before a cleaving is performed by a mechanism (a cleaving machine or a scribing machine), the wafer of FIG. 4(f) is lapped at the rear face thereof such that its total thickness becomes about 100 μm. Thereafter, the photolithography process of this embodiment is performed. As a result, laser diodes are divided into chips respectively.

Figure 5:
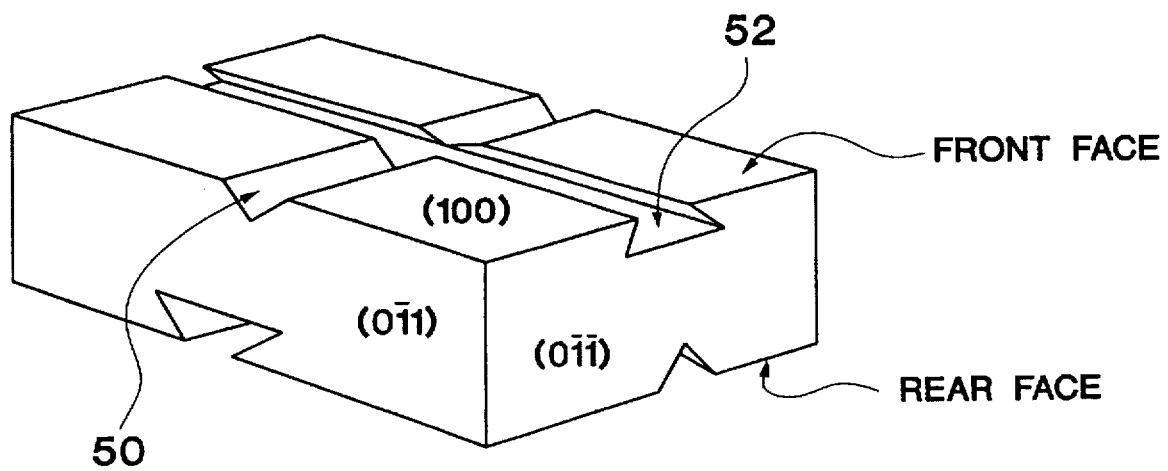
FIG. 5 is a perspective view of the photo cleaving lines formed in an embodiment of the present invention.
Figure 6A:
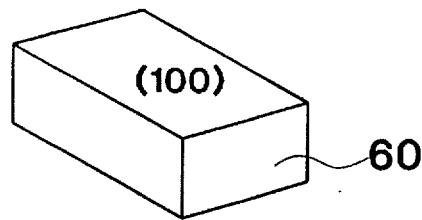
FIGS. 6(a)–6(d) are perspective views of a fabrication process for a laser diode in an embodiment of the present invention.
Figure 6B:
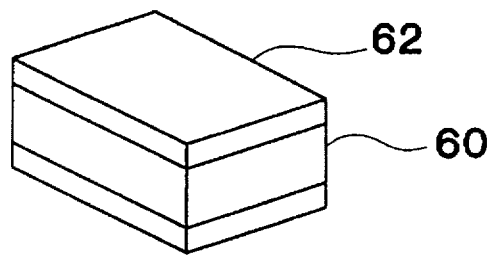
Figure 6C:
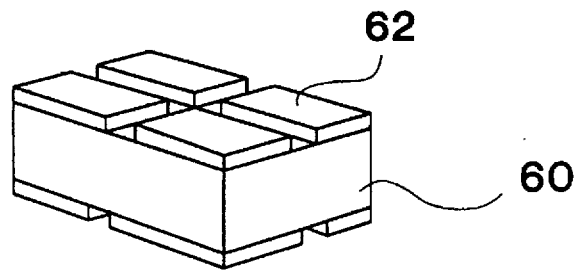
Figure 6D:
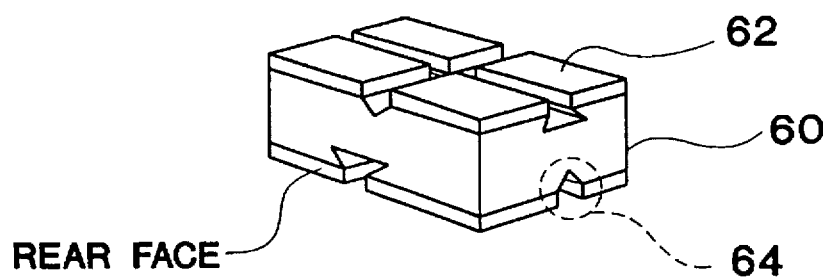

The photo cleaving lines are formed as follows:

a. The crystal of GaAs has a Zinc-blend lattice structure. Namely, a single GaAs crystal has several different atomic arrangement densities and combination structures between atoms in accordance with the direction of the crystal phase. As a result, the single GaAs crystal has different etching structures in accordance with the etched plane which are called anisotropic characteristics. Accordingly, the etched shape is changed by the direction of a mask. As shown in FIG. 5, one can form a V-shaped groove 50 in the direction of (0$\bar{1}$1) or (0$\bar{1}\bar{1}$) and a dovetail shape 52 in the direction of (011) or (01$\bar{1}$).

b. If one selects a fabrication process of a laser diode using the (100) plane, a cleaving line 64 can be formed with the V-shaped groove at the rear face by etching processes. An example of this fabrication process is illustrated in FIGS. 6(a)–6(d). A wafer 60 is provided to have the laser diode formed on the (100) surface as shown in FIG. 6(a). A mask 62 is positioned over the (100) surface as shown in FIG. 6(b) and patterned as shown in FIG. 6(c). The cleaving line 64 with the V-shaped groove is etched on the rear face of the wafer 60 as shown in FIG. 6(d).

Generally, a chemical etching process (or wet etching process) is formed as follows. First, the surface of the crystal is ionized to an oxidized material liable to be etched by a reaction material (e.g., etchant: $H_2O_2$ etc.). The ionized material is chemically reacted with an etching solution. Accordingly, the oxidized material starts to melt and the wafer melts from the surface to its downside. Then, a V or a dovetail shape is formed in accordance with an etching speed in a plane or a direction of a crystal to be etched. As mentioned above, GaAs crystals have different etching speeds in accordance with a plane or a direction of a crystal to be etched. The etching process of this embodiment melts atoms of a crystal by a serial process oxidizing or deoxidizing the surface of GaAs.

Figure 7A:
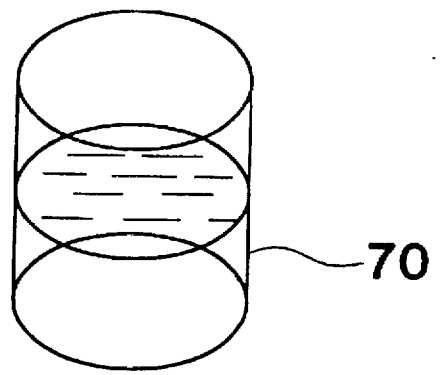
FIGS. 7(a) and 7(b) illustrate an etching process for an embodiment of the present invention.
Figure 7B:
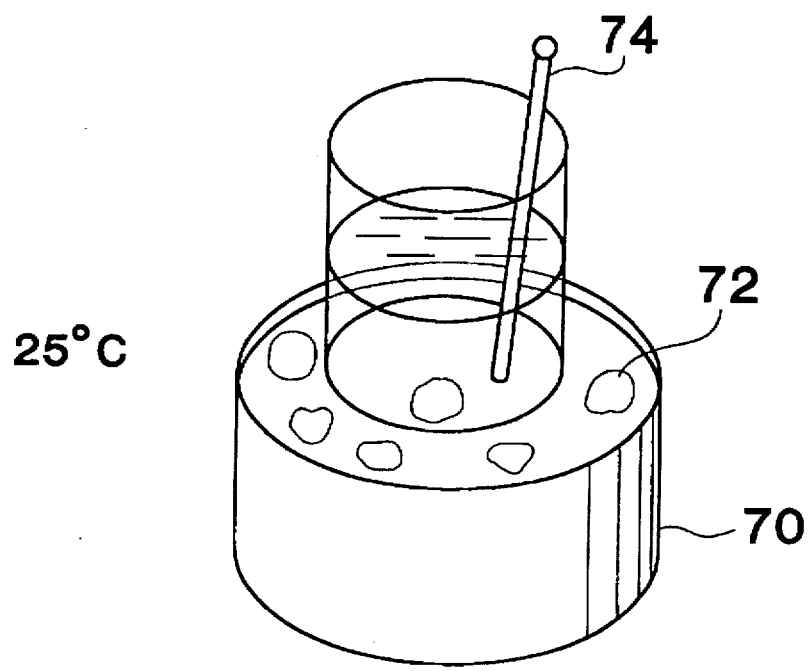

The etching process of this embodiment is as follows:

First, as shown in FIG. 7(a), $H_2SO_4$, $H_2O_2$ and $H_2O$ as etching solutions are exactly mixed at a ratio of 1:8:1 in a beaker 70. Subsequently, as shown in FIG. 7(b), this beaker is dipped into ice water 72, and a mixed etching solution of the beaker 70 is well stirred by a thermometer 74 until the temperature descends to about 25° C. (normal temperature). Thereafter, the wafer coated with a photoresist by a photolithography process is dipped into the mixed etching solution for a predetermined time. Subsequently, the wafer is taken out of the mixed etching solution and then is cleansed by DI water.

Wherein, $H_2O_2$ is used as an oxidizer for oxidizing the surface of GaAs, $H_2SO_4$ is used as a deoxidizer and $H_2O$ is used as a dilutent.

Thus, the photolithography process in which the cleaving grooves are made from the rear side as described above has various advantages such that the mirror face is not damaged during the cleaving process and the edges of the mirror face are not hurt during the process, whereby the life expectancy of the laser is extended and the yield of the diode is increased.

The invention being thus described, it will be obvious that the same may be varied in many ways. Such variations are not to be regarded as a departure from the spirit and scope of the invention, and all such modifications as would be obvious to one skilled in the art are intended to be included in the scope of the following claims.

What is claimed is:

1. A method of cleaving a semiconductor wafer comprising the steps of:

a) coating a first photoresist on a front surface of a semiconductor wafer having a plurality of semiconductor laser elements formed on said semiconductor wafer;

b) patterning the first photoresist so as to form guide mark patterns for cleaving in the first photoresist;

c) coating a second photoresist on a rear surface of said semiconductor wafer;

d) removing an edge part of the second photoresist, wherein said edge part is located at the guide mark patterns for cleaving;

e) etching the semiconductor wafer to form guide marks using the patterned first photoresist and the second photoresist as masks, the guide marks being formed through said semiconductor wafer;

f) patterning the second photoresist so as to form stripe patterns in the second photoresist on the rear surface;

g) etching the rear surface of said semiconductor wafer so as to form V-shaped grooves;

h) removing said first photoresist and said second photoresist; and i) cleaving said semiconductor wafer along said V-shaped grooves into bars, each bar being a semiconductor laser.

2. A method of cleaving a semiconductor wafer comprising the steps of:

a) coating a first photoresist on a first surface of a semiconductor wafer having a plurality of semiconductor laser elements formed on said semiconductor wafer;

b) patterning the first photoresist so as to form guide mark patterns for cleaving in the first photoresist;

c) coating a second photoresist on a second surface of said semiconductor wafer opposite the first surface;

d) removing an edge part of the second photoresist, wherein said edge part is located at the guide mark patterns for cleaving;

e) etching the semiconductor wafer to form guide marks using the patterned first photoresist as a mask, the guide marks being formed through said semiconductor wafer;

f) patterning the second photoresist so as to form stripe patterns, in the second photoresist on the second surface, for cleaving using said guide marks;

g) etching the second surface of said semiconductor wafer so as to form dovetail shaped cleaving lines;

h) removing said first photoresist and said second photoresist; and i) cleaving said semiconductor wafer along said cleaving lines.

3. A method of cleaving a semiconductor wafer comprising the steps of:

a) coating a first photoresist on a first surface of a semiconductor wafer having a plurality of semiconductor laser elements formed on said semiconductor wafer;

b) patterning the first photoresist so as to form guide mark patterns for cleaving in the first photoresist;

c) coating a second photoresist on a second surface of said semiconductor wafer opposite the first surface;

d) removing an edge part of the second photoresist, wherein said edge part is located at the guide mark patterns for cleaving;

e) etching the semiconductor wafer to form guide marks using the patterned first photoresist and the second photoresist as masks, the guide marks being formed through said semiconductor wafer;

f) patterning the second photoresist so as to form striped patterns in the second photoresist on the second surface for cleaving using said guide marks;

g) etching the second surface of said semiconductor wafer so as to form lines of V-shaped or dovetail shaped grooves thereon;

h) removing said first photoresist and said second photoresist; and i) cleaving said semiconductor wafer along said lines formed in step g) above.

* * * * *